United States Patent
Barmettler et al.

(10) Patent No.: US 9,039,867 B2
(45) Date of Patent: May 26, 2015

(54) METHOD FOR DETACHING A SEMICONDUCTOR CHIP FROM A FOIL

(71) Applicant: Besi Switzerland AG, Cham (CH)

(72) Inventors: Ernst Barmettler, Emmenbrucke (CH); Fabian Hurschler, Lucerne (CH); Brian Pulis, Knonau (CH)

(73) Assignee: Besi Switzerland AG, Cham (CH)

( * ) Notice: Subject to any disclaimer, the term of this patent is extended or adjusted under 35 U.S.C. 154(b) by 65 days.

(21) Appl. No.: 13/839,586

(22) Filed: Mar. 15, 2013

(65) Prior Publication Data

US 2013/0255889 A1    Oct. 3, 2013

(30) Foreign Application Priority Data

Mar. 30, 2012    (CH) .......................................... 453/12

(51) Int. Cl.
- B32B 38/10    (2006.01)
- H01L 21/67    (2006.01)
- H01L 21/677   (2006.01)
- H01L 21/02    (2006.01)
- H01L 21/00    (2006.01)

(52) U.S. Cl.
CPC ..... H01L 21/67005 (2013.01); *Y10T 156/1168* (2015.01); *H01L 21/67739* (2013.01); *Y10S 156/943* (2013.01); *H01L 21/67* (2013.01); *H01L 21/02* (2013.01); *Y10S 156/931* (2013.01);
(Continued)

(58) Field of Classification Search
CPC . Y10S 156/931; Y10S 156/932; H01L 21/00; H01L 21/02; H01L 21/67; H01L 21/67739
USPC ................... 156/716, 765, 932, 943
See application file for complete search history.

(56) References Cited

U.S. PATENT DOCUMENTS

| | | | |
|---|---|---|---|
| 6,824,643 B2 | 11/2004 | Yoshimoto et al. | |
| 7,115,482 B2 | 10/2006 | Maki et al. | |

(Continued)

FOREIGN PATENT DOCUMENTS

| | | |
|---|---|---|
| JP | 2007-158103 | 6/2007 |
| WO | 2005/117072 | 12/2005 |
| WO | 2011/125492 | 10/2011 |

OTHER PUBLICATIONS

Search Report in Singapore Application No. 201301431-1, dated Apr. 25, 2014.

*Primary Examiner* — Philip Tucker
*Assistant Examiner* — Nickolas Harm
(74) *Attorney, Agent, or Firm* — Nixon Peabody LLP

(57) ABSTRACT

A method for detaching a semiconductor chip from a foil uses a die ejector comprising plates having a straight supporting edge and an L-shaped supporting edge comprises:
lifting of the plates to a height $H_1$ above the surface of a cover plate;
lowering of a first pair of plates with L-shaped supporting edge;
optionally, lowering of a second pair of plates with L-shaped supporting edge;
lifting of the plates that have not yet been lowered to a height $H_2 > H_1$;
staggered lowering of plates that have not yet been lowered, with at least one or several plates not being lowered;
optionally, lowering of the plates that have not yet been lowered to a height $H_3 < H_2$;
lowering of the plates until all plates are lowered, and
moving away of the chip gripper,
wherein the chip gripper touches the semiconductor chip before lowering the last three plates.

5 Claims, 4 Drawing Sheets

(52) U.S. Cl.
CPC ........... *H01L21/00* (2013.01); *H01L 21/67132*
(2013.01); *Y10S 156/932* (2013.01)

(56) References Cited

U.S. PATENT DOCUMENTS

| | | | |
|---|---|---|---|
| 8,092,645 B2 | 1/2012 | Yip et al. | |
| 8,250,742 B2 | 8/2012 | Kloeckner et al. | |
| 2008/0086874 A1 | 4/2008 | Cheung et al. | |
| 2008/0227239 A1* | 9/2008 | Shibata et al. | 438/110 |
| 2008/0318346 A1 | 12/2008 | Maki et al. | |
| 2010/0252205 A1* | 10/2010 | Chan et al. | 156/584 |

* cited by examiner

METHOD FOR DETACHING A SEMICONDUCTOR CHIP FROM A FOIL

PRIORITY CLAIM

Applicant hereby claims foreign priority under 35 U.S.C. §119 from Swiss Application No. 453/12 filed Mar. 30, 2012, the disclosure of which is herein incorporated by reference.

FIELD OF THE INVENTION

The invention relates to a method for detaching a semiconductor chip from a foil.

BACKGROUND OF THE INVENTION

The semiconductor chips are typically provided on a foil held by a frame, which is also known in the field as a tape, for processing on a semiconductor mounting apparatus. The semiconductor chips adhere to the foil. The frame with the foil is accommodated by a displaceable wafer table. The wafer table is displaced in order to supply one semiconductor chip after the other at a location and the supplied semiconductor chip is taken up by a chip gripper and placed on a substrate in cycles. The removal of the supplied semiconductor chip from the foil is supported by a chip ejector (known in the field as a die ejector) arranged beneath the foil.

A method for detaching a semiconductor chip from the foil is known from U.S. Pat. No. 7,115,482, in which a die ejector is used having several plates disposed adjacent to one another. The plates are lifted either jointly for detaching the semiconductor chip and then lowered sequentially from the outside to the inside, or lifted sequentially from the outside to the inside in order to form a pyramidal elevation protruding beyond the supporting plane. Such die ejectors and methods are also known from U.S. Pat. No. 8,250,742, US 2010-252205 and U.S. Pat. No. 8,092,645.

SUMMARY OF THE INVENTION

The invention is based on the object of further improving such a detaching method.

According to the invention, a chip gripper and a die ejector comprising first plates having a straight supporting edge and second plates having an L-shaped supporting edge are used to detach a semiconductor chip from a foil. In an initial position, the supporting edges of the plates form a supporting plane on which the foil rests. The method comprises the following steps:

A) lifting of the plates, so that the supporting edges of the plates assume a height $H_1$ above the surface of a cover plate of the die ejector;
B) lowering of a first pair of plates with L-shaped supporting edge;
C) optionally, lowering of a second pair of plates with L-shaped supporting edge;
D) lifting of the plates that have not yet been lowered, so that the supporting edges of the plates that have not yet been lowered assume a height $H_2 > H_1$ above the surface of the cover plate;
E) staggered lowering of plates that have not yet been lowered in a specific sequence, with at least one or several plates not being lowered;
F) optionally, lowering of at least the plates that have not yet been lowered, so that the supporting edges of the plates that have not yet been lowered assume a height $H_3 < H_2$ above the surface of the cover plate;
G) lowering of the plates that have not yet been lowered until all plates are lowered, and
H) moving away of the chip gripper with the semiconductor chip, wherein the chip gripper is positioned above the semiconductor chip and lowered until it touches the semiconductor chip at the latest before the lowering of the last three plates.

Preferably, the plates are fixed to a carrier, the carrier being displaceable perpendicularly to the surface of the cover plate and the plates liftable and lowerable relative to the carrier. In the initial position, the carrier is disposed in a predetermined position $z_0$ and the plates are lifted relative to the carrier, so that the supporting edges of the plates form a supporting plane on which the foil rests. Preferably, in step A, the carrier is lifted by a predetermined distance $\Delta z_1$, in step D, the carrier is lifted by a predetermined distance $\Delta z_2$, and in the optional step F the carrier is lowered by a predetermined distance $\Delta z_3$.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not true to scale.

DETAILED DESCRIPTION OF THE INVENTION

Figure 1:
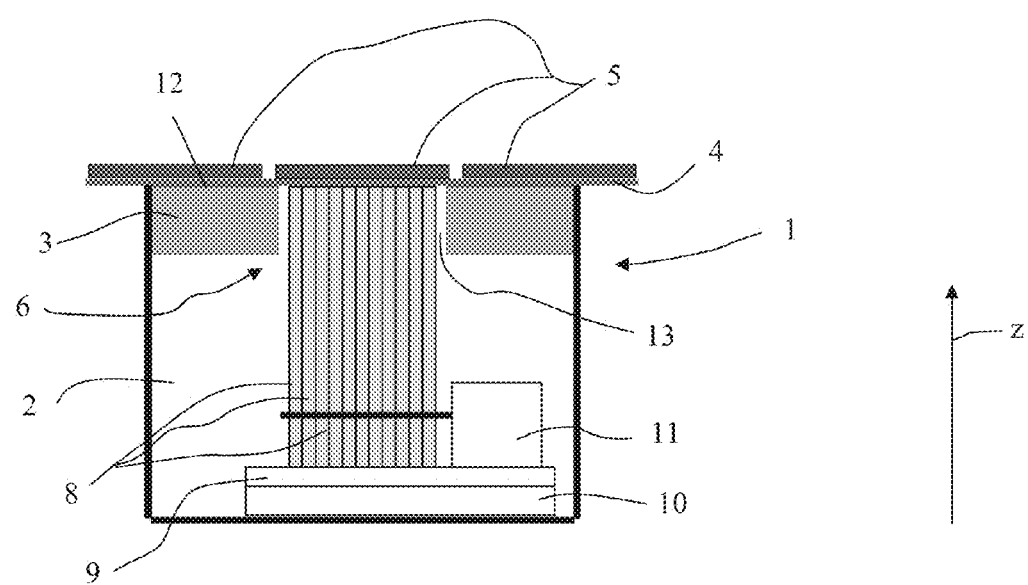
FIG. 1 shows a lateral view and a cross-sectional view of a die ejector.
Figure 2:
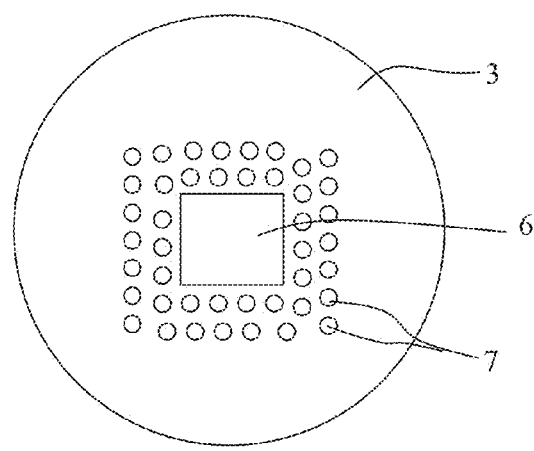
FIG. 2 shows the die ejector in a top view.

FIG. 1 shows a lateral cross-sectional view of a die ejector 1 with a configuration which is principally known from EP 2184765. The die ejector 1 comprises an enclosed chamber 2 which can be supplied with a vacuum and comprises a preferably removable and exchangeable cover plate 3, on which rests a part of the foil 4 with the semiconductor chips 5. The chamber 2 can also be formed by the housing of the die ejector 1 or a part thereof. The cover plate 3 can also be a cover. The cover plate 3 contains a rectangular hole 6 in the middle which is approximately as large as the semiconductor chips 5 and preferably a plurality of further holes 7, which are only shown in FIG. 2 and are used for sucking up the foil 4 when the chamber 2 is supplied with vacuum. The die ejector 1 further comprises a plurality of plates 8 which are arranged next to one another in the interior of the chamber 2 and are fixed to a carrier 9. The die ejector 1 comprises a first drive 10 which is used for displacing the carrier 9 perpendicularly to the surface 12 of the cover plate 3, i.e. in the z-direction in this case. The die ejector 1 comprises a second drive 11 which is used for displacing the plates 8 relative to the carrier 9 in the direction perpendicular to the surface 12 of the cover plate 3. Both the carrier 9 and also the plates 8 can therefore be lifted and lowered relative to the surface of the foil 4.

The plates 8 protrude into the central hole 6 of the cover plate 3. There is a circumferential gap 13 between the plates 8 and the edge of the hole 6. The chamber 2 can be supplied with vacuum. The area assumed by the plates 8 within the hole 6 of the cover plate 3 of the die ejector 1 is preferably slightly smaller than the area of a semiconductor chip 5, namely dimensioned in such a way that the semiconductor chip 5 will protrude beyond the area assumed by the plates 8 on all sides in the lateral direction by approximately 0.5 to 1 mm. The number and the shape of the plates 8 depend on the dimensions of the semiconductor chip 5.

In the case of very small semiconductor chips, i.e. typically in the case of semiconductor chips 5 with an edge length of up to approximately 5 mm, only plates 8 with straight supporting edges will be used. In the case of medium-sized semiconductor chips, i.e. typically in the case of semiconductor chips 5 with edge lengths in the range of approximately 5 to 7 mm, plates 8 with straight supporting edges and a pair of plates with L-shaped supporting edges will be used. In the case of even larger semiconductor chips 5, plates 8 with straight supporting edges and two or more pairs (usually two pairs) of plates 8 with L-shaped supporting edges will be used. The plates 8 with straight supporting edges are arranged in the center and respectively surrounded in pairs by plates with L-shaped supporting edges.

Figure 3:
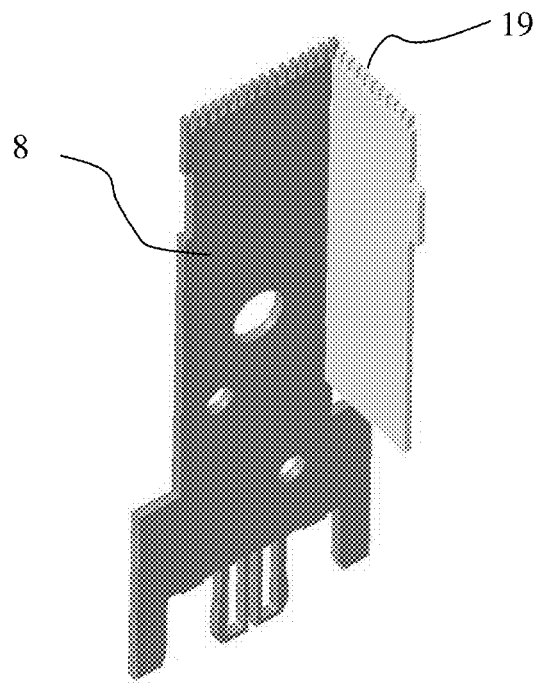
FIG. 3 shows a plate with an L-shaped supporting edge in a perspective view.

Only plates 8 with straight supporting edges are shown in FIG. 1 for reasons of clarity of the illustration. FIG. 3 shows a perspective view of a plate 8 with an L-shaped supporting edge 19. The supporting edge 19 is provided in this embodiment with a plurality of teeth, so that the vacuum in the intermediate spaces between the teeth will reach the bottom side of the foil 4 and will therefore increase the suction force. The supporting edge can also be arranged without teeth, i.e. as a flat edge.

Figure 4:
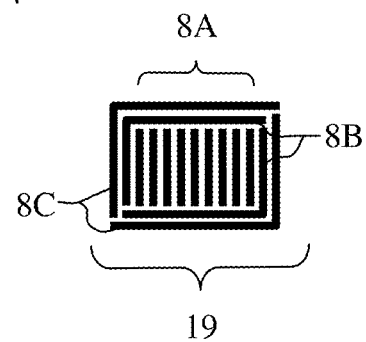
FIG. 4 shows a top view of supporting edges of the plates of a die ejector.

FIG. 4 shows a top view of the supporting edges 19 of the plates 8 of a die ejector 1 which is configured for relatively large semiconductor chips. The plates of this embodiment comprise nine plates 8A with straight supporting edges and two pairs of plates 8B and 8C with L-shaped supporting edges, i.e. a total of four plates with L-shaped supporting edges. The terms of "straight" and "L-shaped" relate to the shape of the supporting edges 19 in the supporting plane.

The first pair of the plates 8B with L-shaped supporting edges (the inner pair) encloses the plates 8A with the straight supporting edges. The second pair of the plates 8C with L-shaped supporting edges (the outer pair) encloses the inner pair of the plates 8B with L-shaped supporting edges.

Figure 9:
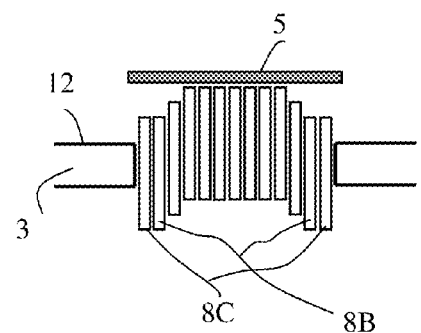
Figure 10:
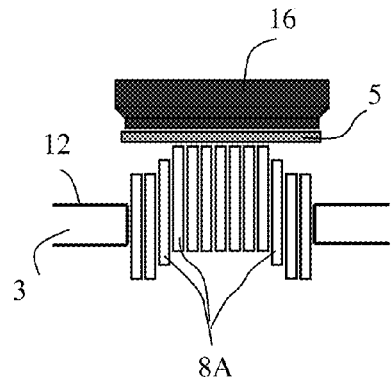

The detachment and removal of a semiconductor chip 5 from the foil 4 occurs by means of the die ejector 1 in cooperation with a chip gripper 16 (FIG. 10). The chip gripper 16 advantageously contains a suction member which can be supplied with vacuum and which will suck up the semiconductor chip and tightly hold the same. The chip gripper 16 can also contain a suction member based on the Bernoulli effect, which suction member needs to be supplied with compressed air in order to achieve the suction effect. The method for detaching a semiconductor chip will be explained in detail by reference to FIGS. 5 to 13, with said drawings respectively representing a snapshot. The foil 4 and the drive means for the movement of the plates 8 are not shown in FIGS. 5 to 13. A movement of the plates 8 in the positive z-direction will be designated as lifting and a movement of the plates 8 in the negative z-direction will be designated as lowering.

In order to detach the next semiconductor chip from the foil 4, the foil 4 is displaced relative to the die ejector 1, so that the semiconductor chip 5 to be detached is located above the hole 6 of the cover plate 3. Furthermore, all plates 8 are lifted relative to the carrier 9, so that their supporting edges 19 are situated in a common plane, and the carrier 9 is brought to a predetermined position $z_0$ in which the supporting edges 19 are flush with the surface 12 of the cover plate 3. In this initial position the foil 4 rests on the supporting edges 19 of the plates 8. The method for detaching the semiconductor chip 5 from the foil 4 comprises the following steps:

A) supplying the chamber 2 with vacuum, so that the foil 4 is drawn towards the cover plate 3;

B) lifting of the carrier 9 by a predetermined distance $\Delta z_1$, so that the supporting edges 19 of the plates 8 will assume a height $H_1$ above the surface 12 of the cover plate 3;

C) lowering of the outermost pair of plates 8C with the L-shaped supporting edge;

D) optionally, lowering of the second pair of plates 8B with L-shaped supporting edge;

E) lifting of the carrier 9 by a predetermined distance $\Delta z_2$, so that the supporting edges of the plates that have not yet been lowered will assume a height $H_2 > H_1$ above the surface 12 of the cover plate 3;

F) staggered lowering of plates 8 that have not yet been lowered in a predetermined sequence, with at least one or several (preferably three) plates 8A not being lowered;

G) optionally, lowering of the carrier 9 by a predetermined distance $\Delta z_3$, so that the supporting edges of the plates that have not yet been lowered assume a height $H_3 < H_2$ above the surface 12 of the cover plate 3;

H) staggered lowering of the plates 8A that have not yet been lowered;

I) moving away of the chip gripper 16 with the semiconductor chip 5;

J) wherein the chip gripper 16 is positioned above the semiconductor chip 5 and lowered until it touches and tightly holds the semiconductor chip 5 at the latest before lowering of the last three plates 8A.

Figure 5:
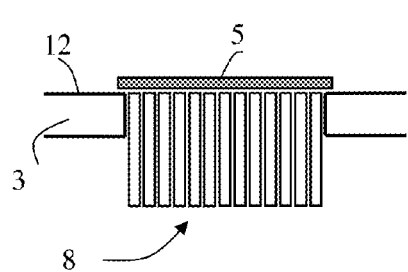
FIGS. 5 to 13 show snapshots of a detaching process.

FIG. 5 shows a snapshot of the initial position.

Figure 6:
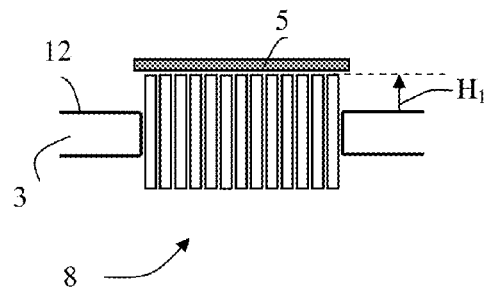

FIG. 6 shows a snapshot after step B.

Figure 7:
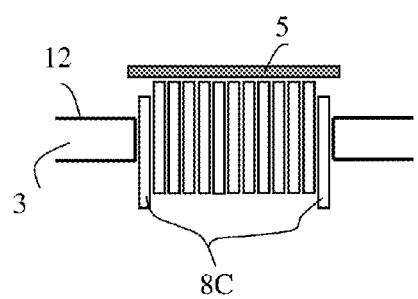

FIG. 7 shows a snapshot after step C.

Figure 8:
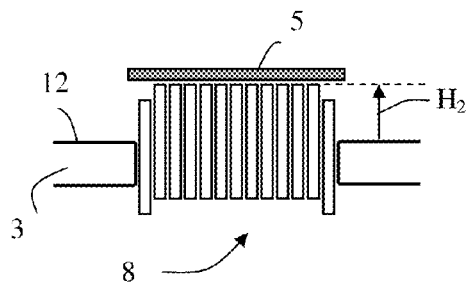

FIG. 8 shows a snapshot after step E.

Figure 11:
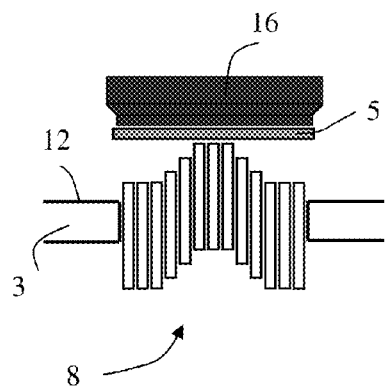

FIGS. 9 to 11 show successive snapshots between the E and G.

Figure 12:
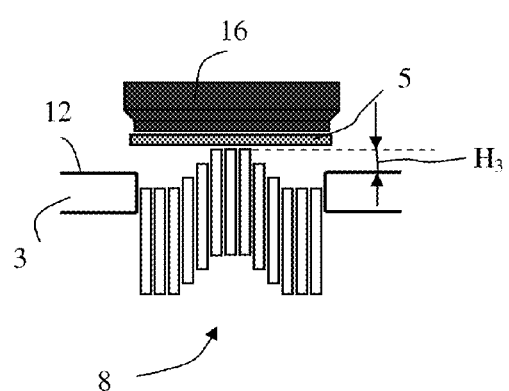

FIG. 12 shows a snapshot after step G.

Figure 13:
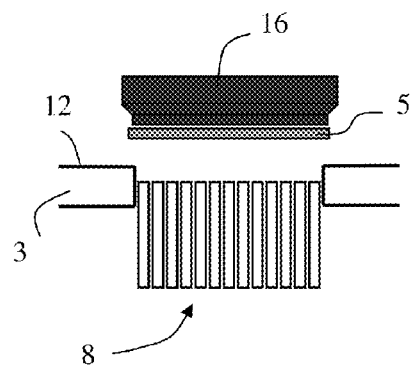

FIG. 13 shows a snapshot after step H.

The lowering of the respective next plates can occur before the preceding plates have been lowered completely, as shown in FIGS. 8 to 12. The point in time from which the support of the chip gripper 16 is required for the detachment of the foil 4 from the semiconductor chip 5 depends on several factors such as the thickness of the semiconductor chips 5, the size of the semiconductor chips 5, the adhesive force of the foil 4, the suction force exerted by the vacuum on the foil 4. The later the chip gripper 16 needs to be used the larger the throughput of the automatic assembly machine.

In order to prepare the removal of the next semiconductor chip 5, the plates 8 are brought back to the initial position again.

The use of plates with L-shaped supporting edges reduces the influence of mechanical loads on the adjacent semiconductor chips and therefore allows reaching a height $H_2$ which is larger than in the state of the art, which promotes the detachment of the semiconductor chip from the foil.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

The invention claimed is:

1. A method for detaching a semiconductor chip from a foil by means of a chip gripper and a die ejector, wherein the die ejector comprises a first plurality plates having a straight supporting edge and a second plurality of plates having an L-shaped supporting edge, a first set of two of the second plurality of plates are arranged to form a first pair of outermost plates, the first plurality of plates and the second plurality of plates protruding into a central hole of a cover plate, and wherein the supporting edges of the first plurality of plates and the second plurality of plates in an initial position form a supporting plane on which the foil rests, the method comprising the following steps:
   A) lifting all of the first plurality of plates and the second plurality of plates, so that the supporting edges of the first plurality of plates and the second plurality of plates assume a height $H_1$ above a surface of the cover plate;
   B) lowering the first pair of outermost plates leaving a first group of plates raised;
   C) lifting the first group of plates, so that the supporting edges of the first group of plates assume a height $H_2 > H_1$ above the surface of the cover plate;
   D) lowering some but not all of the first group of plates in a predetermined sequence leaving a last group of at least three plates from the first group of plates;
   E) positioning the chip gripper above the semiconductor chip;
   F) lowering the chip gripper into contact with the semiconductor chip before the lowering of the last group of at least three plates; and
   G) lowering the last group of at least three plates until all of the last group of at least three plates are lowered, wherein steps A to D are executed in the order listed above and before steps F and G.

2. The method of claim 1, wherein:
   the first plurality of plates and the second plurality of plates are fixed to a carrier;
   the carrier is configured to be displaceable perpendicularly to the surface of the cover plate;
   the first plurality of plates and the second plurality of plates are configured to be lifted and lowered relative to the carrier;
   the carrier is disposed in an initial predetermined position $z_0$ and the first plurality of plates and the second plurality of plates are configured to be lifted relative to the carrier, so that the supporting edges of the first plurality of plates and the second plurality of plates form a supporting plane on which the foil rests, and wherein the method further comprises:
   lifting the carrier a predetermined distance $\Delta z_1$ in step A; and
   lifting the carrier a predetermined distance $\Delta z_2$ in step C.

3. The method of claim 1, wherein a second set of two of the second plurality of plates is arranged to form a second pair of second outermost plates, the method further comprising:
   after step B, lowering the second pair of second outermost plates of the second plates.

4. The method of claim 1, further comprising:
   after step D, lowering the last group of at least three plates, so that the supporting edges of the last group of at least three plates assume a height $H_3 < H_2$ above the surface of the cover plate.

5. The method of claim 4, wherein:
   the first plurality of plates and the second plurality of plates are fixed to a carrier;
   the carrier is configured to be displaceable perpendicularly to the surface of the cover plate;
   the first plurality of plates and the second plurality of plates are configured to be lifted and lowered relative to the carrier;
   the carrier is disposed in an initial predetermined position $z_0$ and the plates are configured to be lifted relative to the carrier, so that the supporting edges of the first plurality of plates and the second plurality of plates form a supporting plane on which the foil rests, and wherein the method further comprises:
   lifting the carrier a predetermined distance $\Delta z_1$ in step A;
   lifting the carrier a predetermined distance $\Delta z_2$ in step C; and
   lowering the carrier a predetermined distance $\Delta z_3$ in the 'after step D' step.

* * * * *